(12) United States Patent
Takei et al.

(10) Patent No.: US 9,257,544 B2
(45) Date of Patent: Feb. 9, 2016

(54) SEMICONDUCTOR DEVICE AND FABRICATION METHOD OF SEMICONDUCTOR DEVICE

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Manabu Takei, Tsukuba (JP); Yoshiyuki Yonezawa, Tsukuba (JP)

(73) Assignees: FUJI ELECTRIC CO., LTD., Kawasaki-shi (JP); NATIONAL INSTITUTE OF ADVANCED INDUSTRIAL SCIENCE and TECHNOLOGY, Tokyo (JP)

( * ) Notice: Subject to any disclaimer, the term of this patent is extended or adjusted under 35 U.S.C. 154(b) by 0 days.

(21) Appl. No.: 14/674,861

(22) Filed: Mar. 31, 2015

(65) Prior Publication Data
US 2015/0311328 A1    Oct. 29, 2015

(30) Foreign Application Priority Data
Apr. 25, 2014 (JP) ................................. 2014-092132

(51) Int. Cl.
| | | |
|---|---|---|
| H01L 29/739 | (2006.01) | |
| H01L 29/16 | (2006.01) | |
| H01L 29/66 | (2006.01) | |

(52) U.S. Cl.
CPC ........ *H01L 29/7397* (2013.01); *H01L 29/1608* (2013.01); *H01L 29/66348* (2013.01)

(58) Field of Classification Search
None
See application file for complete search history.

(56) References Cited

U.S. PATENT DOCUMENTS

| | | | |
|---|---|---|---|
| 6,768,168 B1 | 7/2004 | Takahashi | |
| 7,049,196 B2 * | 5/2006 | Noble | ............... H01L 27/108 257/E21.652 |
| 8,076,719 B2 * | 12/2011 | Zeng et al. | .......... H01L 29/0634 257/330 |

(Continued)

FOREIGN PATENT DOCUMENTS

| | | |
|---|---|---|
| EP | 0 732 749 A2 | 9/1996 |
| EP | 0 837 508 A2 | 4/1998 |

(Continued)

*Primary Examiner* — William Coleman
*Assistant Examiner* — Kien Ly
(74) *Attorney, Agent, or Firm* — Westerman, Hattori, Daniels & Adrian, LLP

(57) ABSTRACT

A semiconductor device includes semiconductor layers of a first conductivity-type and a second conductivity-type stacked on a silicon carbide semiconductor and having differing impurity concentrations. Trenches disposed penetrating the semiconductor layer of the second conductivity-type form a planar striped pattern; and a gate electrode is disposed therein through a gate insulation film. First and second semiconductor regions respectively of the first and the second conductivity-types have impurity concentrations exceeding that of the semiconductor layer of the second conductivity-type and are selectively disposed therein. The depth of the second semiconductor region exceeds that of the semiconductor layer of the second conductivity-type, but not that of the trenches. The second semiconductor region is arranged at given intervals along the length of the trenches. In the silicon carbide semiconductor below the trench bottoms, a third semiconductor region of the second conductivity-type and having a floating potential is disposed covering the trench bottoms.

4 Claims, 16 Drawing Sheets

(56) References Cited

U.S. PATENT DOCUMENTS

| | | | |
|---|---|---|---|
| 8,354,711 B2 * | 1/2013 | Zeng et al. | H01L 29/0623 257/330 |
| 2009/0311839 A1 * | 12/2009 | Miyahara et al. | H01L 21/26513 438/270 |
| 2010/0140628 A1 | 6/2010 | Zhang | |
| 2010/0327313 A1 | 12/2010 | Nakamura | |
| 2011/0210391 A1 * | 9/2011 | Kitagawa | H01L 29/7825 257/331 |
| 2013/0092978 A1 | 4/2013 | Sugawara et al. | |
| 2013/0234200 A1 | 9/2013 | Fujii | |

FOREIGN PATENT DOCUMENTS

| | | |
|---|---|---|
| JP | 8-316479 A | 11/1996 |
| JP | 10-178174 A | 6/1998 |
| JP | 2008-211178 A | 9/2008 |
| JP | 2013-89700 A | 5/2013 |
| JP | 2013-149798 A | 8/2013 |
| JP | 2013-187440 A | 9/2013 |
| WO | 2009/122486 A1 | 10/2009 |

* cited by examiner

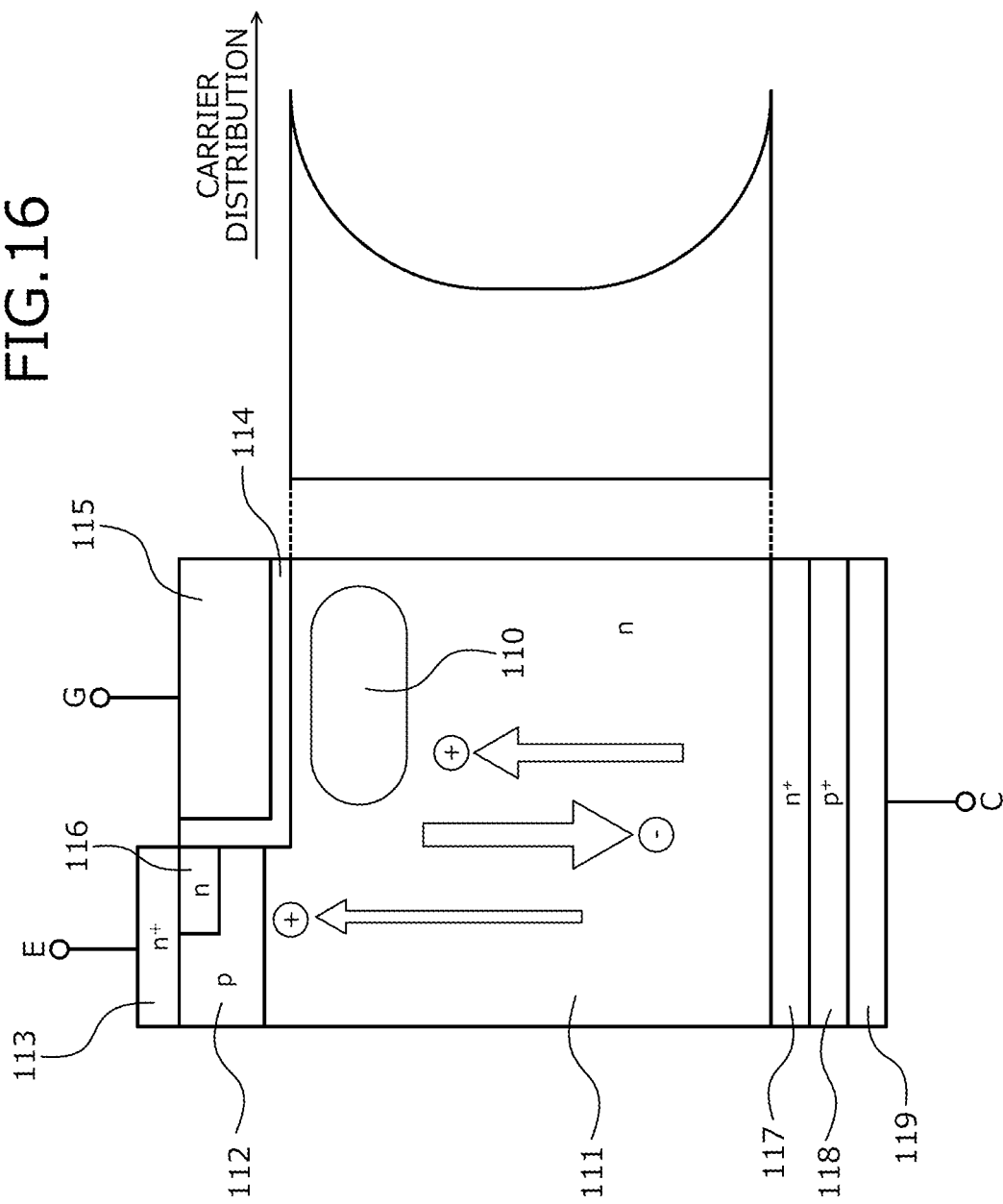

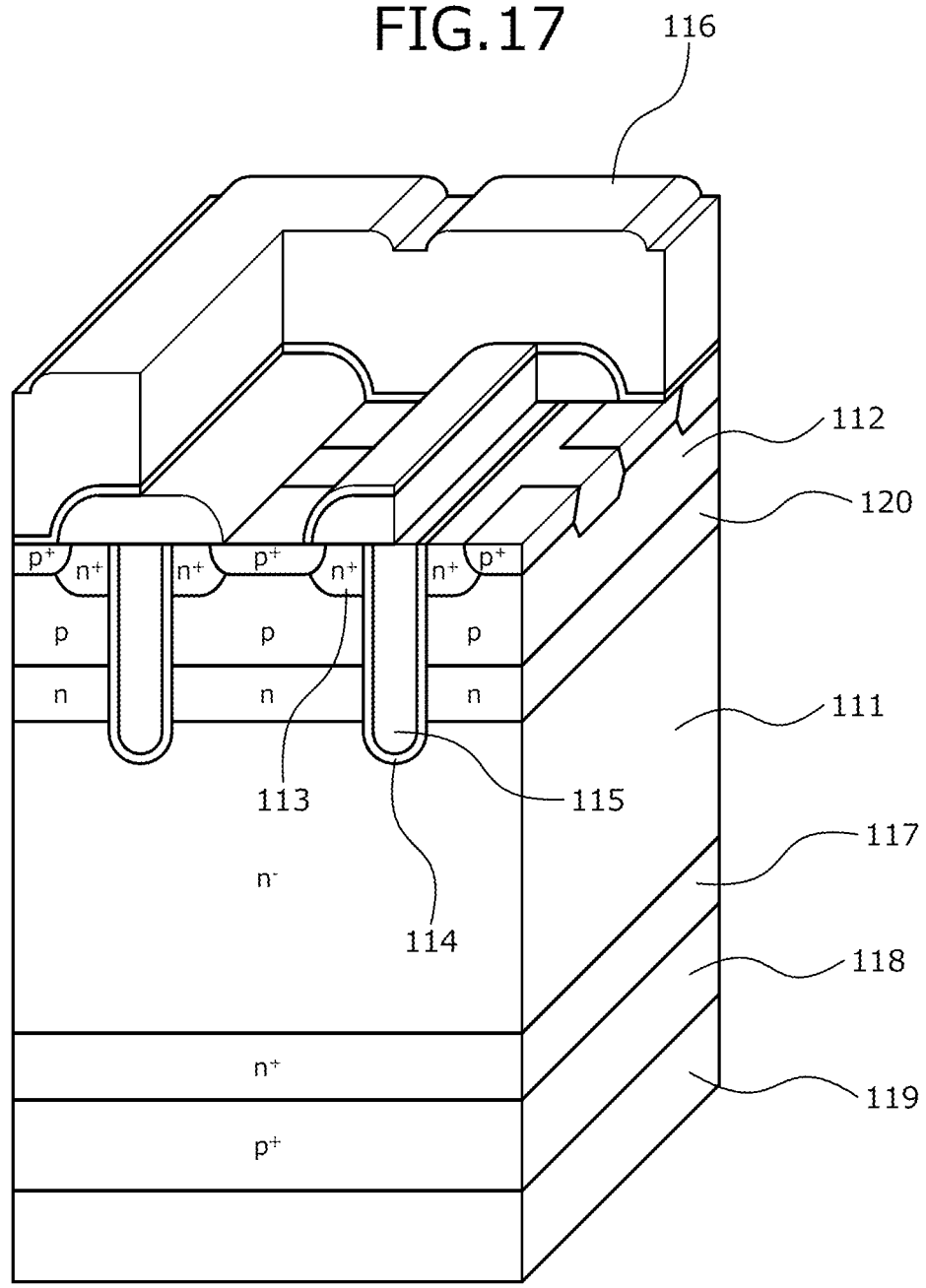

SEMICONDUCTOR DEVICE AND FABRICATION METHOD OF SEMICONDUCTOR DEVICE

FIELD

The present invention is related to a semiconductor device and a fabrication method the semiconductor device.

BACKGROUND

Conventionally, an insulated gate bipolar transistor (IGBT) has been experimentally fabricated that uses a silicon carbide (SiC) semiconductor as the semiconductor material (hereinafter, referred to as "SiC-IGBT") as a semiconductor device including MOS gate (insulated gate formed by a metal oxide film semiconductor) structures of a planar gate type. The structure of a conventional planar gate SiC-IGBT will be described below. FIGS. 14 and 15 are cross-sectional views of the structure of a conventional planar gate SiC-IGBT. FIG. 14 depicts a p-channel IGBT and FIG. 15 depicts an n-channel IGBT.

In the p-channel IGBT depicted in FIG. 14, on one surface side of a p$^-$-type drift layer 101, components are disposed such as a MOS gate structure including an n-type base region 102, a p$^+$-type emitter region 103, a gate insulation film 104, and a gate electrode 105, and an emitter electrode 106. On the other surface side of the p$^-$-type drift layer 101, a p-type buffer layer 107, an n$^+$-type collector layer 108, and a collector electrode 109 are disposed. The n-channel IGBT depicted in FIG. 15 has a structure formed by inverting the conductivity types of the p-channel IGBT depicted in FIG. 14. Reference numerals "111" to "119" respectively denote an n$^-$-type drift layer, a p-type base region, an p$^+$-type emitter region, a gate insulation film, a gate electrode, an emitter electrode, an n-type buffer layer, a p$^+$-type collector layer, and a collector electrode.

Operation of the IGBT will be described taking an example of the n-channel IGBT. When positive voltage is applied to the gate electrode 115, an inversion layer of the p-type base region 112 is excited in a surface layer of a region immediately under the gate electrode 115. Through this inversion layer, electrons are injected from the n$^+$-type emitter region 113 into the p-type base region 112 of the surface layer of the n$^-$-type drift layer 111. The electrons injected into the p-type base region 112 pass through the n$^-$-type drift layer 111 and reach the p$^+$-type collector layer 118. Holes (positive holes) are injected from the p$^+$-type collector layer 118 toward the n$^-$-type drift layer 111. Thereby, the IGBT transitions to the "ON" state. In the "ON" state, the electrons and the holes accumulate inside the n$^-$-type drift layer 111 such that the charge neutralization condition is satisfied, and the carrier concentration of the n$^-$-type drift layer 111 is increased.

The electric conductivity in the n$^-$-type drift layer 111 is increased (conductivity modulation) and the "ON" voltage when a predetermined current flows is reduced. For the holes to be injected from the p$^+$-type collector layer 118 toward the n$^-$-type drift layer 111, a forward voltage substantially equal to a built-in voltage needs to be applied to a p-n junction between the p$^+$-type collector layer 118 and the n$^-$-type drift layer 111. For a bipolar device using the silicon carbide semiconductor as the semiconductor material, because the built-in voltage is high, the current rise voltage is high and the rate of the build-in voltage accounting for in the "ON" voltage is high in the "ON" state. A unipolar device having no built-in voltage is, therefore, advantageous in a breakdown voltage class including breakdown voltages up to several kV. On the other hand, the bipolar device using a silicon carbide semiconductor is suitable for a device in a breakdown voltage class including voltages greater than or equal to 10 kV.

To reduce the electrical resistance (the "ON" voltage) by accumulating the carriers (electrons and holes) in the n$^-$-type drift layer 111, it is necessary to efficiently inject the electrons from the emitter side to the n$^-$-type drift layer 111 and efficiently inject the holes from the collector side to the n$^-$-type drift layer 111. To efficiently inject the holes from the collector side, the impurity concentration of the p$^+$-type collector layer 118 merely has to be increased. On the other hand, to efficiently inject the electrons on the emitter side, the carriers (the electrons and holes) merely have to be confined to the n$^-$-type drift layer 111 as many as possible, that is, the effect of electron injection enhancement (injection enhanced (IE)) merely has to be enhanced. The IE effect is a technique that is widely used to improve the property of the IGBT using silicon (Si) as the semiconductor material (hereinafter, referred to as "Si-IGBT").

The following two structures are already in practical use as front face element structures each having the IE effect. FIG. 16 is an explanatory diagram of a structure of a conventional trench gate Si-IGBT. In FIG. 16, the carrier distribution in the n$^-$-type drift layer 111 is depicted on the right, and the flows of the carriers in the "ON" state are depicted using arrows in a cross-sectional view on the left. FIG. 17 is a perspective diagram of the structure of another example of a conventional trench gate Si-IGBT. The first structure is an injection enhanced gat transistor (IEGT) structure that accumulates the holes in the n$^-$-type drift layer 111 in a vicinity of a bottom portion of the trench in the "ON" state by reducing the width of a mesa region (hereinafter, referred to as "mesa width") between adjacent trenches (trenches each having the gate electrode 115 embedded therein) (FIG. 16). The second structure is a carrier-stored trench-gate bipolar transistor (CSTBT) structure formed by inserting an n-type carrier accumulation (carrier-stored (CS)) layer 120 between the n$^-$-type drift layer 111 and the p-type base region 112 in the mesa region between the adjacent trenches (FIG. 17).

For a trench gate Si-IGBT, the IE effect can be enhanced by setting the front face element structure to be a structure having a narrow mesa width or a structure having a CS layer disposed therein. On the other hand, for a planar gate Si-IGBT, the IE effect is difficult to enhance and any improvement of attributes is, therefore, limited. For a SiC-IGBT, it is also effective to enhance the IE effect to improve attributes. To realize an attribute exceeding that of the planar gate SiC-IGBT, the trench gate SiC-IGBT is employed and the front face element structure is set to be a structure having a narrow mesa width or a structure having the CS layer disposed therein, whereby improvement of the property can be expected. For example, when a structure having a narrow mesa width is applied, a voltage drop is generated by concentrating the hole current in the mesa region and thereby, the injection is enhanced of the electrons from the electron accumulation layer (the inversion layer) formed in the trench side wall to the drift layer.

According to a device that has been proposed as a semiconductor device having the IE effect, an n-type layer having an impurity concentration higher than that of the n$^-$-type drift layer is disposed between the n$^-$-type drift layer and the p-type base layer, whereby the carrier distribution in the n$^-$-type drift layer substantially becomes like the carrier distribution in a diode, and the "ON" voltage is reduced maintaining the current value capable of being turned off to be high (see, for example, Japanese Laid-Open Patent Publication No. H08-316479).

According to a another proposed device, an n-type layer having a higher concentration than that of an n⁻-type layer is disposed between the n⁻-type layer and the p-type layer in an IGBT including at least a "p⁺n⁻pn⁺" structure from the collector side toward the emitter side (see, for example, Japanese Laid-Open Patent Publication No. H10-178174).

The following device has also been proposed as yet another device. A drift layer of a second conductivity type is disposed on a substrate of a first conductivity type. A current suppression layer is disposed on the drift layer. The current suppression layer is of a second conductivity type and has a doping concentration that is higher than the doping concentration of the drift layer. A well region of the first conductivity type is present in the current suppression layer. The well region has a junction depth that is smaller than the thickness of the current suppression layer, and the current suppression layer laterally extends under the well region. An emitter region of the second conductivity type is present in the well region (see, for example, Japanese Laid-Open Patent Publication No. 2008-211178).

According to yet another proposed device, an n-type impurity diffusion region (an embedded diffusion layer) having a relatively high concentration is disposed in a vicinity of a region for an n⁻-type drift layer to constitute a p-n junction with a p-type body region in a structure of a MOS transistor portion (see, for example, Published Japanese-Translation of PCT Application, Publication No. 2009/122486 (paragraph 0079 and FIG. 39)).

The following device has also been proposed as yet another device. An n⁺-type semiconductor layer (nCELb) is disposed on the surface of an n⁻-type drift layer. The impurity concentration of nCELb is higher than the impurity concentration of the n⁻-type drift layer. An n-type semiconductor layer (nCELu) is disposed on the surface of nCELb. The impurity concentration of nCELu is higher than the impurity concentration of the n⁻-type drift layer and is lower than the impurity concentration of nCELb. A p-type body region is selectively disposed in the surface layer of nCELu (see, for example, Japanese Laid-Open Patent Publication No. 2013-089700).

A device has also been proposed as yet another device that includes an n-type drift layer stacked on one surface of a p-type silicon carbide semiconductor substrate having a high impurity concentration, an n-type carrier storage layer having an impurity concentration higher than that of the drift layer and disposed inside the drift layer on the surface side to divide the drift layer into two layers of an upper and a lower layer, a p-type base region disposed in the surface-side drift layer of the two divided drift layers, an n-type emitter region disposed in the surface layer of the p-type base region, and a gate electrode disposed through a gate insulation film on the surface of the p-type base region and on the surface of the surface-side drift layer whose side face is adjacent to the p-type base region and whose main face is in contact with the carrier storage layer (see, for example, Japanese Laid-Open Patent Publication No. 2013-149798).

According to another proposed device, an n-type charge accumulation layer and a p-type body layer are sequentially disposed on an n⁻-type Si substrate, and a trench gate is disposed through a gate insulation film in a trench that penetrates the p-type body layer (see, for example, Japanese Laid-Open Patent Publication No. 2013-187440 (paragraph 0013 and FIG. 1)).

To inject the carriers into the n⁻-type drift layer, however, a high forward bias needs to be applied to the p-n junction between the p-type base region and the n⁻-type drift layer because the built-in voltage of the silicon carbide semiconductor is high. With the SiC-IGBT applied with the front face element structure having a narrow mesa width (the width of the mesa region between adjacent trenches), when the voltage drop caused by the hole current in the mesa region is lower than the built-in voltage of the silicon carbide semiconductor, a problem arises in that the electron injection enhancement (IE) effect is not sufficiently achieved from the emitter side to the n⁻-type drift layer. To enhance the IE effect in the SiC-IGBT, the mesa width needs to be reduced to a length smaller than the Si-IGBT and the trench depth needs to be increased, however, problems arise in that deep etching of the trench is difficult and the patterning to form the front face element structure having a narrow mesa width is also difficult.

When the front face element structure of the trench gate type is employed, a high electric field is applied to the bottom portion of the trench in a "normally off" state of the device and a problem arises in that the gate insulation film that is formed along the inner wall of the trench is degraded. Although the silicon carbide semiconductor has an advantage in that the critical electric field strength is high at which the avalanche breakdown occurs, however, the electric field applied to the gate insulation film is also increased and a problem, therefore, arises in that the long term reliability of the gate insulation film drops.

SUMMARY

It is an object of the present invention to at least solve the above problems in the conventional technologies.

According to an aspect of an embodiment, a semiconductor device includes a first semiconductor layer of a first conductivity type and formed of a silicon carbide semiconductor; a second semiconductor layer of the first conductivity type and formed of the silicon carbide semiconductor having an impurity concentration higher than that of the first semiconductor layer, the second semiconductor layer being disposed on one face of the first semiconductor layer; a third semiconductor layer of the first conductivity type and formed of the silicon carbide semiconductor having an impurity concentration higher than that of the second semiconductor layer, the third semiconductor layer being disposed on a face that with respect to a first semiconductor layer side of the second semiconductor layer, is on an opposite aspect of the second semiconductor layer; a fourth semiconductor layer of the second conductivity type and formed of the silicon carbide semiconductor, the fourth semiconductor layer being disposed on a face that with respect to a first semiconductor layer side of the third semiconductor layer, is on an opposite aspect of the third semiconductor layer; a first semiconductor region of the first conductivity type and selectively disposed inside the fourth semiconductor layer; trenches that respectively penetrate the fourth semiconductor layer and the first semiconductor region in a depth direction orthogonal to the one face of the first semiconductor layer, the trenches being disposed at predetermined intervals in a first direction parallel to the one face of the first semiconductor layer, the trenches extending in a second direction orthogonal to the first direction and parallel to the one face of the first semiconductor layer to form stripes; a gate electrode that is disposed inside each trench through a gate insulation film; a second semiconductor region of the second conductivity type, having an impurity concentration higher than that of the fourth semiconductor layer, and selectively disposed inside the fourth semiconductor layer, the second semiconductor region having a depth deeper than that of the fourth semiconductor layer and shallower than that of the trenches; a third semiconductor region of the second conductivity type that is disposed to cover a bottom portion of the trenches; a fifth semiconductor layer of the second conductivity type and disposed on the other face of the first semiconductor layer; an emitter electrode that is in contact with the first semiconductor region and the second semiconductor region; and a collector electrode that is in contact with the fifth semiconductor layer.

The other objects, features, and advantages of the present invention are specifically set forth in or will become apparent from the following detailed description of the invention when read in conjunction with the accompanying drawings.

BRIEF DESCRIPTION OF DRAWINGS

FIG. 16 is an explanatory diagram of the structure of a conventional trench gate Si-IGBT; and FIG. 17 is a perspective diagram of the structure of another example of a conventional trench gate Si-IGBT.

DESCRIPTION OF EMBODIMENTS

Figure 1:
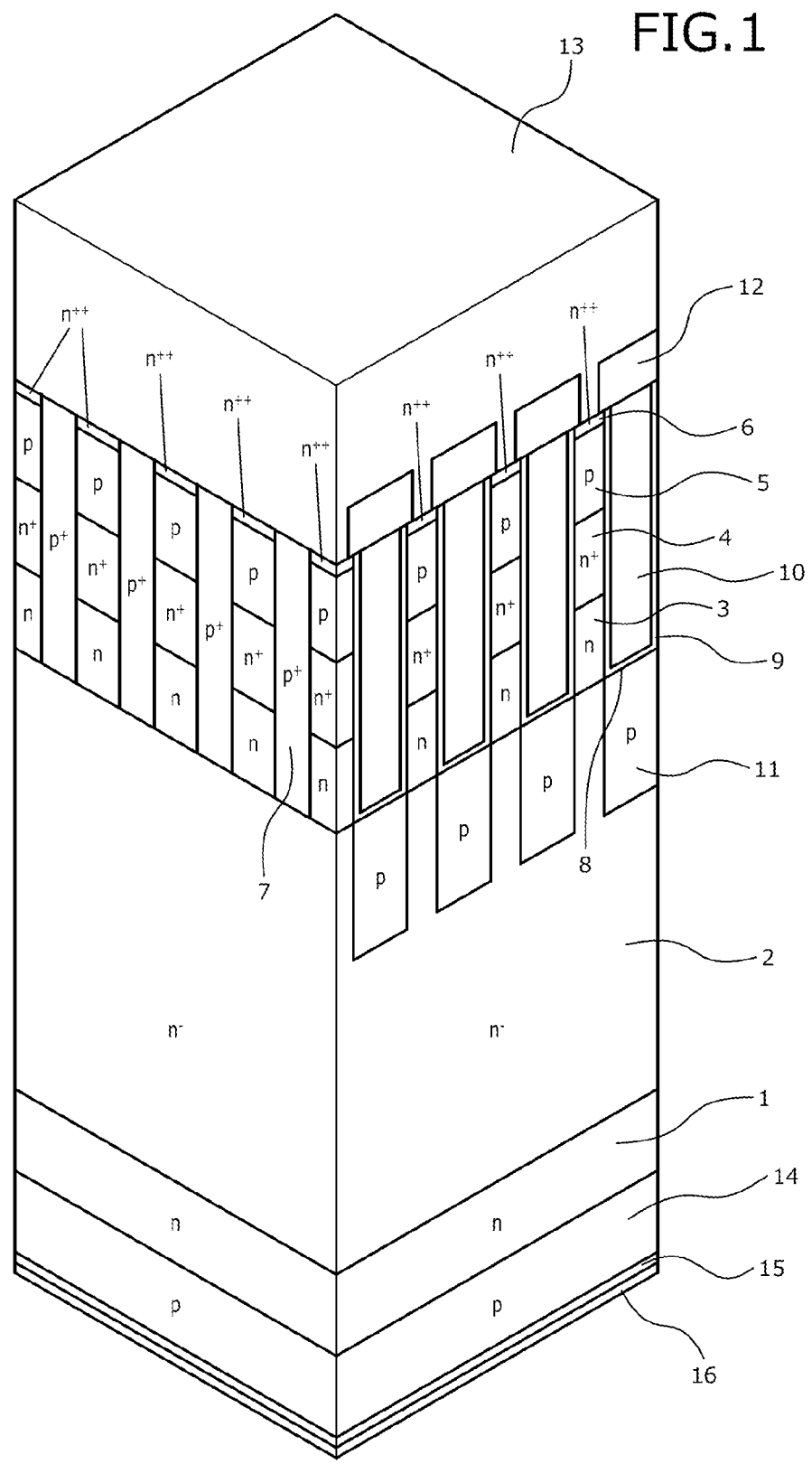
FIG. 1 is a perspective diagram of a structure of a semiconductor device according to an embodiment.

A preferred embodiment of a semiconductor device and a fabrication method of a semiconductor device according to the present invention will be described below with reference to the accompanying drawings. In the present specification and the accompanying drawings, layers and regions prefixed with n or p mean that majority carriers are electrons or holes, respectively. Additionally, + and − appended to n or p mean that the impurity concentration is higher and lower, respectively, than layers and regions without + and −. In the description of the embodiment below and the accompanying drawings, identical constituent elements will be given the same reference numerals and will not repeatedly be described. In the present specification, when Miller indices are described, "−" means a bar added to an index immediately after the "−", and a negative index is expressed by prefixing "−" to the index.

A structure of the semiconductor device according to the embodiment will be described taking an example of an re-channel SiC-IGBT that uses the silicon carbide (SiC) semiconductor. FIG. 1 is a perspective diagram of the structure of the semiconductor device according to an embodiment. The semiconductor device depicted in FIG. 1 is a trench gate SiC-IGBT that includes layers sequentially stacked on an n$^-$-type drift layer (a first semiconductor layer) 2 and disposed in a mesa region between adjacent trenches 8, such as a p-type base layer (a fourth semiconductor layer) 5, a high concentration n-type drift layer (a second semiconductor layer) 3 and an n$^+$-type carrier accumulation (CS) layer (a third semiconductor layer) 4 disposed sequentially from the n$^-$-type drift layer 2 side and between the n$^-$-type drift layer 2 and the p-type base layer 5, a p-type body region (a second semiconductor region) 7 disposed inside the p-type base layer 5, and a p-type guard region (a third semiconductor region) 11 at a floating potential (electrically floating) disposed in a vicinity of the bottom portion of the trench 8.

For example, on the front face of the n-type semiconductor substrate including the silicon carbide semiconductor (hereinafter, referred to as "n-type SiC substrate"), silicon carbide epitaxial layers are sequentially stacked to be the n$^-$-type drift layer 2, the high concentration n-type drift layer 3, the n$^+$-type CS layer 4, and the p-type base layer 5. The n-type SiC substrate 1 functions as a field stop (FS) layer that suppresses the depletion layer extending from a p-n junction on the emitter side during the "off" time period from reaching a p$^+$-type collector layer 15 described later. The carriers (electrons and holes) are accumulated in the n$^-$-type drift layer 2 in an "always-on" state. The high concentration n-type drift layer 3 and the n$^+$-type CS layer 4 each have a function to enhance the IE effect.

A proper impurity concentration of the high concentration n-type drift layer 3 is, for example, greater than or equal to $5 \times 10^{14}/\text{cm}^3$ and less than or equal to $1.0 \times 10^{17}/\text{cm}^3$. A proper impurity concentration of the n$^+$-type CS layer 4 is, for example, greater than or equal to $5.0 \times 10^{14}/\text{cm}^3$ and less than or equal to $5.0 \times 10^{18}/\text{cm}^3$. Preferably, the n$^+$-type CS layer 4 has a high impurity concentration that is, for example, greater than or equal to $1.0 \times 10^{17}/\text{cm}^3$, and has a thickness greater than or equal to 0.5 µm. The electrons injected from the emitter side into the n$^-$-type drift layer 2 can be increased by setting the impurity concentrations of the high concentration n-type drift layer 3 and the n$^+$-type CS layer 4 to be within the above ranges. In the silicon carbide semiconductor, the critical electric field strength at which the avalanche breakdown occurs is higher than that of silicon (Si) by 10-fold, and any significant degradation of the element breakdown voltage can, therefore, be prevented even when the high impurity concentration n$^+$-type CS layer 4 is disposed in the mesa region. Sufficient breakdown voltage can, therefore, be maintained, and the "ON" voltage can be reduced by enhancing the IE effect.

The trench 8 is disposed at a depth at which the trench 8 penetrates at least the p-type base layer 5 in the depth direction and reaches the n$^+$-type CS layer 4. The depth direction refers to a direction from the front face toward the back face of the SiC epitaxial substrate (a semiconductor chip) formed by stacking, on the n-type SiC substrate 1, the n$^-$-type drift layer 2, the high concentration n-type drift layer 3, the n$^+$-type CS layer 4, and the p-type base layer 5. FIG. 1 depicts the trench 8 that in the depth direction, penetrates the p-type base layer 5, the n$^+$-type CS layer 4, and the high concentration n-type drift layer 3 and that reaches the n$^-$-type drift layer 2. The depth of the trench 8 merely has to be a depth with which the trench 8 divides the p-type base layer 5 into plural sections, and can be varied depending on, for example, the distance between the p-type base layer 5 and the p-type guard region 11 that is determined based on the design conditions. The plural trenches 8 are disposed in, for example, a stripe-like planar pattern.

By dividing the p-type base layer 5 into the plural sections by the trench 8, plural emitter structures are formed each having the mesa region sandwiched by the adjacent trenches 8 as a unit cell. The interval of the adjacent trenches 8, that is, the width of the mesa region (a mesa width) in the direction in which the trenches 8 are aligned (hereinafter, referred to as "trench shorter dimension direction") is very small that is, for example, 1.6 µm. The n$^+$-type CS layer 4 sandwiched by the trenches 8 therefore tends to be depleted though the n$^+$-type CS layer 4 has the high impurity concentration as above, and the element breakdown voltage is not degraded.

A gate insulation film 9 is disposed inside the trench 8 along the inner wall of the trench 8, and a gate electrode 10 is disposed on the inner side of the gate insulation film 9. An n++-type emitter region (a first semiconductor region) 6 and a p+-type body region 7 are selectively disposed inside the p-type base layer 5. In each mesa region between the adjacent trenches 8, the n++-type emitter region 6 and the p+-type body region 7 are alternately disposed repeatedly in a direction (hereinafter, referred to as "trench longer dimension direction") orthogonal to the direction in which the trenches 8 are aligned (the trench shorter dimension direction). The n++-type emitter region 6 and the p+-type body region 7 face the gate electrode 10 through the gate insulation film 9 on a side wall of the trench 8.

The depth of the p+-type body region 7 is greater than the depth of the p-type base layer 5 and is shallower than the depth of the trench 8. The p+-type body region 7 merely has to penetrate at least the p-type base layer 5 and divide the p-type base layer 5 into the plural sections, and the depth of the p+-type body region 7 can be varied to suit design conditions. FIG. 1 depicts the p+-type body region 7 that penetrates the p-type base layer 5, the n+-type CS layer 4, and the high concentration n-type drift layer 3 in the depth direction and that reaches the n−-type drift layer 2. By disposing the p+-type body region 7, the p-type base layer 5 is between the p+-type body regions 7 that are adjacent to each other along the trench longer dimension direction. The p-type base layer 5, therefore, is not to prone to becoming depleted though the p-type base layer 5 has a relatively low impurity concentration, and the element breakdown voltage thereof can be sufficiently assured. The respective disposition patterns of the n++-type emitter region 6 and the p+-type body region 7 in the mesa region may be same as that of each other.

The proper interval between the p+-type body regions 7 adjacent to each other along the trench longer dimension direction is, for example, greater than or equal to 0.5 μm and equal to or smaller than 5.0 μm. The reason for this is as follows. When the interval between the p+-type body regions 7 adjacent to each other along the trench longer dimension direction is less than 0.5 μm, the channel concentration of the inversion layer (the channel) formed in a vicinity of the side wall of the trench 8 of the p-type base layer 5 is reduced and the "ON" voltage is increased in the "always-on" state. On the other hand, when the interval between the p+-type body regions 7 adjacent to each other along the trench longer dimension direction exceeds 5.0 μm, no electric field alleviation effect is achieved and the breakdown voltage is reduced.

The p-type guard region 11 at the floating potential is disposed to cover the bottom portion of the trench 8, in the SiC semiconductor portion (the n−-type drift layer 2 in FIG. 1) immediately below the bottom portion of the trench 8 (on the n-type SiC substrate side). The p-type guard region 11 is disposed along the bottom portion of the trench 8 and covers the overall bottom portion of the trench 8. The p-type guard region 11 has a function of alleviating the electric field applied to the gate insulation film 9. Preferably, the distance in the depth direction between the p-type guard region 11 and the p-type base layer 5 is set to be sufficiently long. The reason for this is as follows. When the distance in the depth direction between the p-type guard region 11 and the p-type base layer 5 is short (that is, the depth of the trench 8 is shallow), in the "always-on" state, the holes (the positive holes) injected from the collector side (the p+-type collector layer 15 described later) into the n−-type drift layer 2 flow into the p-type base layer 5 through the p-type guard region 11 and the distance for the holes to pass through the n+-type CS layer 4 is reduced. This is substantially equivalent to the thickness of the n+-type CS layer 4 being thin, and the accumulation of the carriers in the n−-type drift layer 2 is obstructed because the IE effect is degraded.

The emitter electrode 13 is in contact with the n++-type emitter region 6 and the p+-type body region 7 through contact holes penetrating an interlayer insulator film 12 in the depth direction, and is electrically insulated from the gate electrode 10 by the interlayer insulator film 12. A p-type buffer layer 14 is disposed in the surface layer of the back face of the n-type SiC substrate 1. A p+-type collector layer 15 is disposed in the surface layer of the back face of the n-type SiC substrate 1 at a shallower position from the back face of the substrate than that of the p-type buffer layer 14. A collector electrode 16 is disposed on the overall back face of the n-type SiC substrate 1, that is, the overall surface of the p+-type collector layer 15.

No thermal treatment for activation is executed for the p-type buffer layer 14 and the p+-type collector layer 15 as described later, and crystal faults remain therein. In the "always-on" state, the electrons and the holes tend to, therefore, recouple with each other inside the p-type buffer layer 14, and the electrons flowing from the emitter side toward the collector side are prone to fail to reach the p+-type collector layer 15. The p-type buffer layer 14 functions as the field stop layer. A lot of holes are not injected from the high impurity concentration p+-type collector layer 15 into the n−-type drift layer 2 and the amount of carriers on the collector side can be suppressed. As a result, the loss generated during the "turned-off" time period can be reduced.

Figure 2:
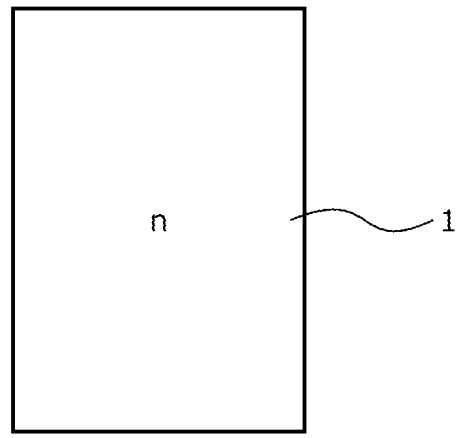
FIGS. 2, 3, and 4 are cross-sectional views of states of the semiconductor device according to the embodiment in the course of fabrication.
Figure 3:
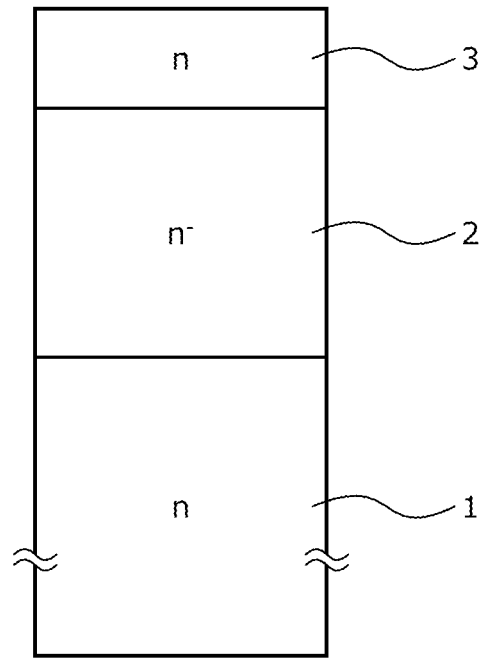
Figure 4:
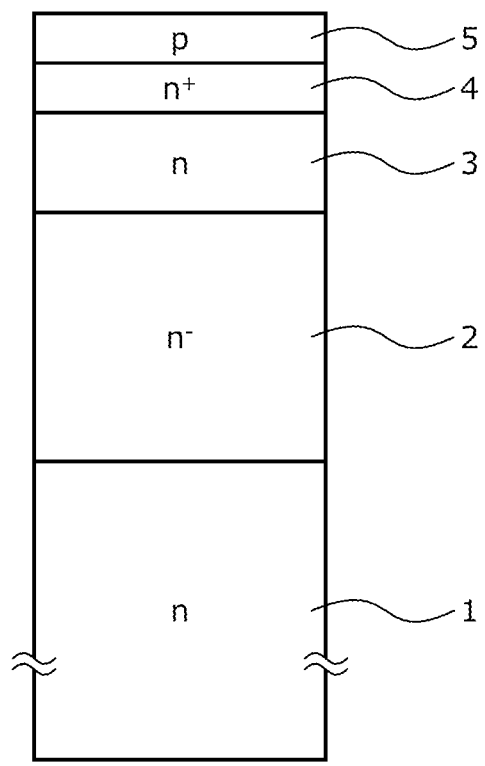

The fabrication method of a semiconductor device according to the embodiment will be described taking an example of a case where an n-channel SiC-IGBT of a 13-kV breakdown voltage class is produced (fabricated). FIGS. 2, 3, and 4 are cross-sectional views of the states of the semiconductor device according to the embodiment in the course of fabrication. FIGS. 5, 6, 7, 8, 9, 10, 11, and 12 are perspective diagrams of the states of the semiconductor device according to the embodiment in the course of fabrication. As depicted in FIG. 2, the n-type SiC substrate 1 (a SiC wafer) having a thickness of 350 μm and including a silicon carbide semiconductor doped with an n-type impurity such as, for example, nitrogen (N) at $4.0 \times 10^{15}/cm^3$ is prepared as the starting material (a starting substrate).

As depicted in FIG. 3, an n−-type epitaxial layer having a thickness of 120 μm and doped with an n-type impurity such as, for example, nitrogen at $5.0 \times 10^{14}/cm^3$ is grown to be the n−-type drift layer 2 on the front face of the n-type SiC substrate 1. The front face of the n-type SiC substrate 1 may be, for example, a (000-1) plane (a so-called C plane). An n-type epitaxial layer having a thickness of 1.8 μm and doped with an n-type impurity such as, for example, nitrogen at $1.0 \times 10^{16}/cm^3$ is grown to be the high concentration n-type drift layer 3 on the n−-type drift layer 2. As depicted in FIG. 4, an n+-type epitaxial layer having a thickness of 0.5 μm and doped with an n-type impurity such as, for example, nitrogen at $7.0 \times 10^{17}/cm^3$ is grown to be the n+-type CS layer 4 on the high concentration n-type drift layer 3.

Figure 5:
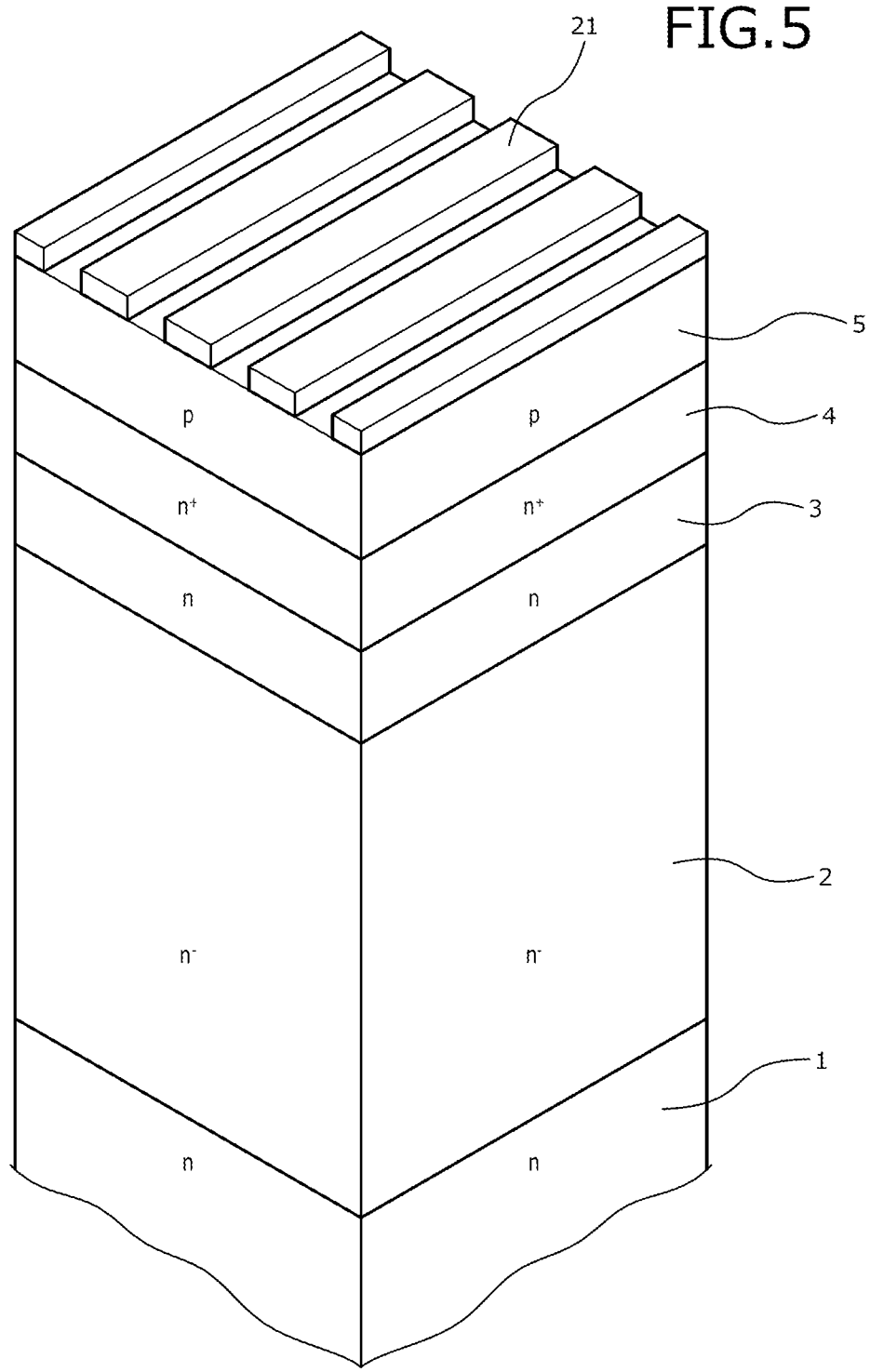
FIGS. 5, 6, 7, 8, 9, 10, 11, and 12 are perspective diagrams of the states of the semiconductor device according to the embodiment in the course of fabrication.

A p-type epitaxial layer having a thickness of 0.7 μm and doped with a p-type impurity such as, for example, aluminum (Al) at $2.5 \times 10^{17}/cm^3$ is grown to be the p-type base region 5 on the n+-type CS layer 4. Thereby, the SiC epitaxial substrate (a SiC epitaxial wafer) is produced that is formed by stacking the n−-type drift layer 2, the high concentration n-type drift layer 3, the n+-type CS layer 4, and the p-type base layer 5 on the n-type SiC substrate 1. As depicted in FIG. 5, an oxide film 21 having a thickness of, for example, 0.8 μm is deposited on the front face (the face on the p-type base layer 5 side) of the SiC epitaxial substrate. Patterning is applied to the oxide film 21 to expose a partial area (not depicted) of a scribe area. The "scribe area" refers to the cut-out area for cutting (dicing) the SiC wafer into individual chips.

An alignment marker (not depicted) having a depth of 0.5 µm is formed in a portion of the scribe area by etching the SiC semiconductor portion (that is, the p-type base layer 5) using the remaining portion of the oxide film 21 as the mask. In the process steps executed later, the alignment marker is used as a positioning pattern to be a guide to match the position of the SiC epitaxial substrate in the horizontal direction with the position of the photo mask. Patterning is applied to the oxide film 21 to form therein stripe-like openings each having a width of 0.8 µm at the pitch of, for example, 2.4 µm.

Figure 6:
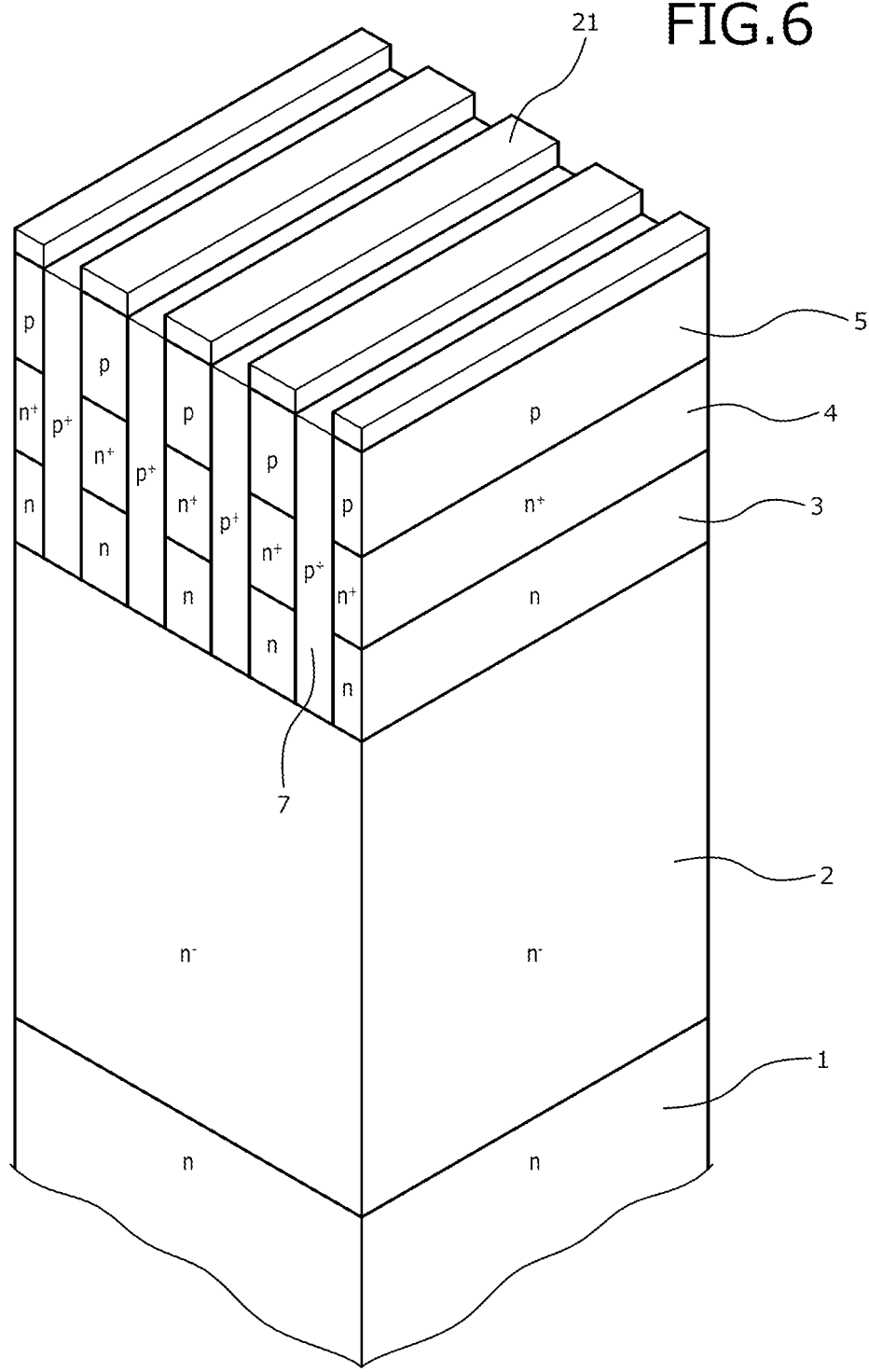

As depicted in FIG. 6, a p-type impurity such as aluminum is ion-implanted at, for example, a dose of $5.0 \times 10^{16}/cm^2$ into the SiC semiconductor portion using the remaining portion of the oxide 21 as a mask to form the $p^+$-type body region 7 in a stripe-like shape. The ion implantation to form the $p^+$-type body region 7 may be multi-stage ion implantation to execute the ion implantation in five stages using different acceleration energies within, for example, a range greater than or equal to 500 keV and less than or equal to 750 keV.

Figure 7:
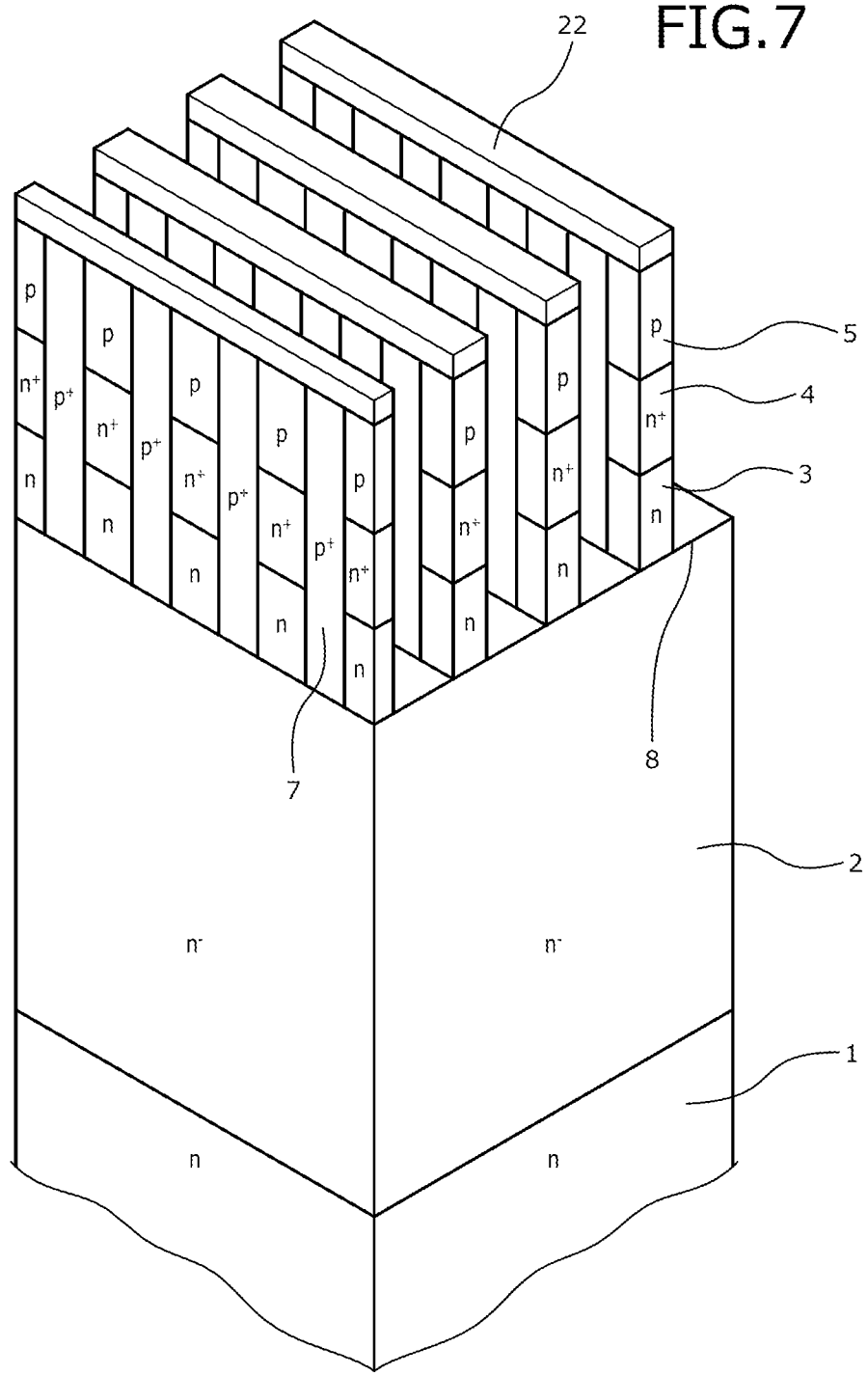

After removing the overall oxide film 21, as depicted in FIG. 7, an oxide film 22 having a thickness of, for example, 0.8 µm is newly deposited on the front face of the SiC epitaxial substrate. Patterning is applied to the oxide film 22 to form stripe-like openings each having, for example, a width of 0.5 µm at the pitch of 2.4 µm extending in a direction orthogonal to the direction in which the stripe-like $p^+$-type body region 7 extends. The SiC semiconductor portion is etched using the remaining portion of the oxide film 22 as the mask to form the trench 8 having a depth of, for example, 1.3 µm.

Figure 8:
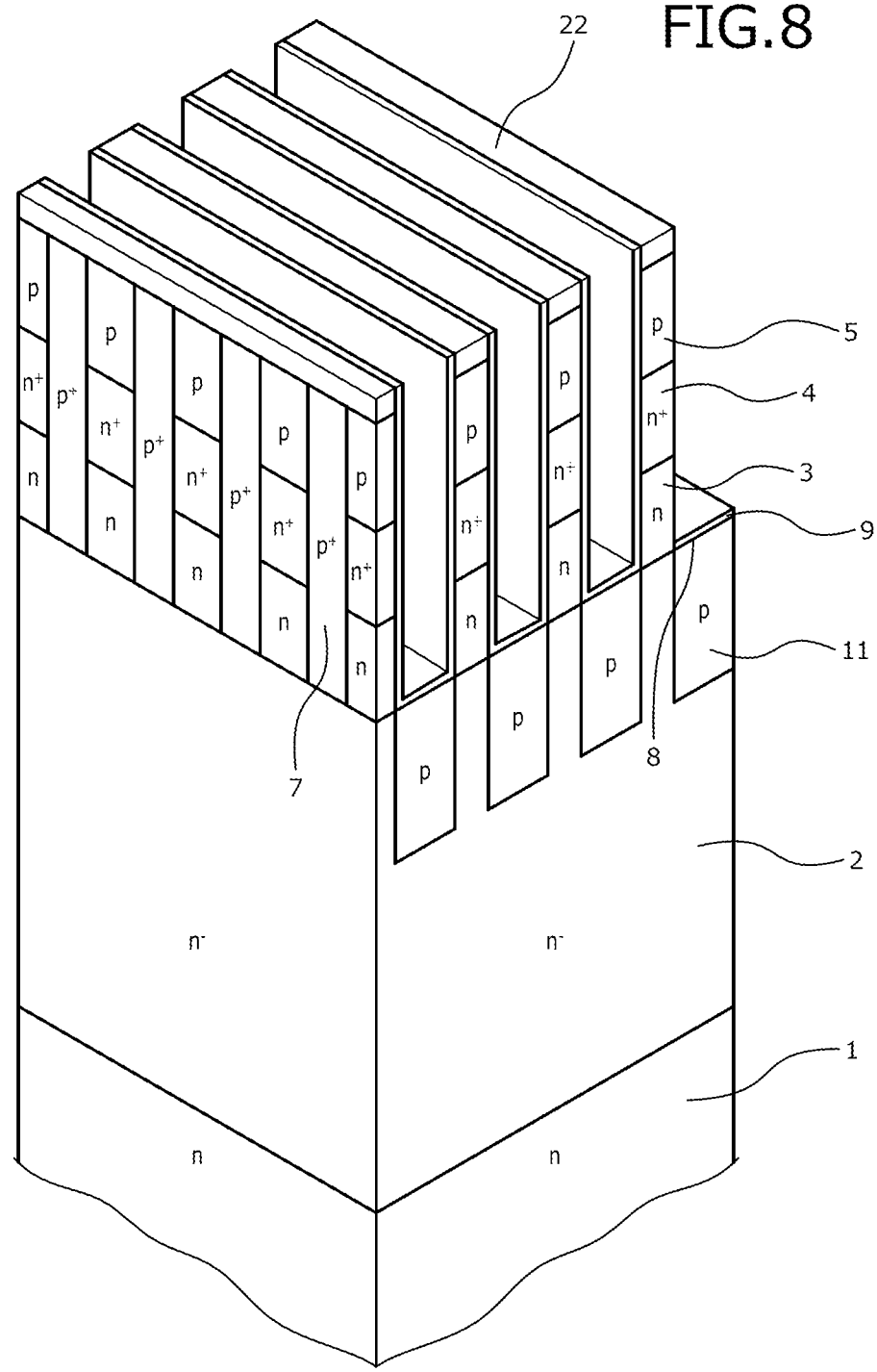

As depicted in FIG. 8, an oxide film (not depicted) having a thickness of, for example, 50 nm is formed along the inner wall of the trench 8 by thermal oxidation. A p-type impurity such as aluminum is ion-implanted, for example, at a dose of $5.0 \times 10^{15}/cm^2$ through the oxide film of the inner wall of the trench 8 using the remaining portion of the oxide film 22 as a mask to form the p-type guard region 11 in the SiC semiconductor portion in the bottom portion of the trench 8. The ion implantation to form the p-type guard region 11 may be multi-stage ion implantation to execute the ion implantation in five stages using different acceleration energies within, for example, a range greater than or equal to 30 keV and less than or equal to 150 keV.

Figure 9:
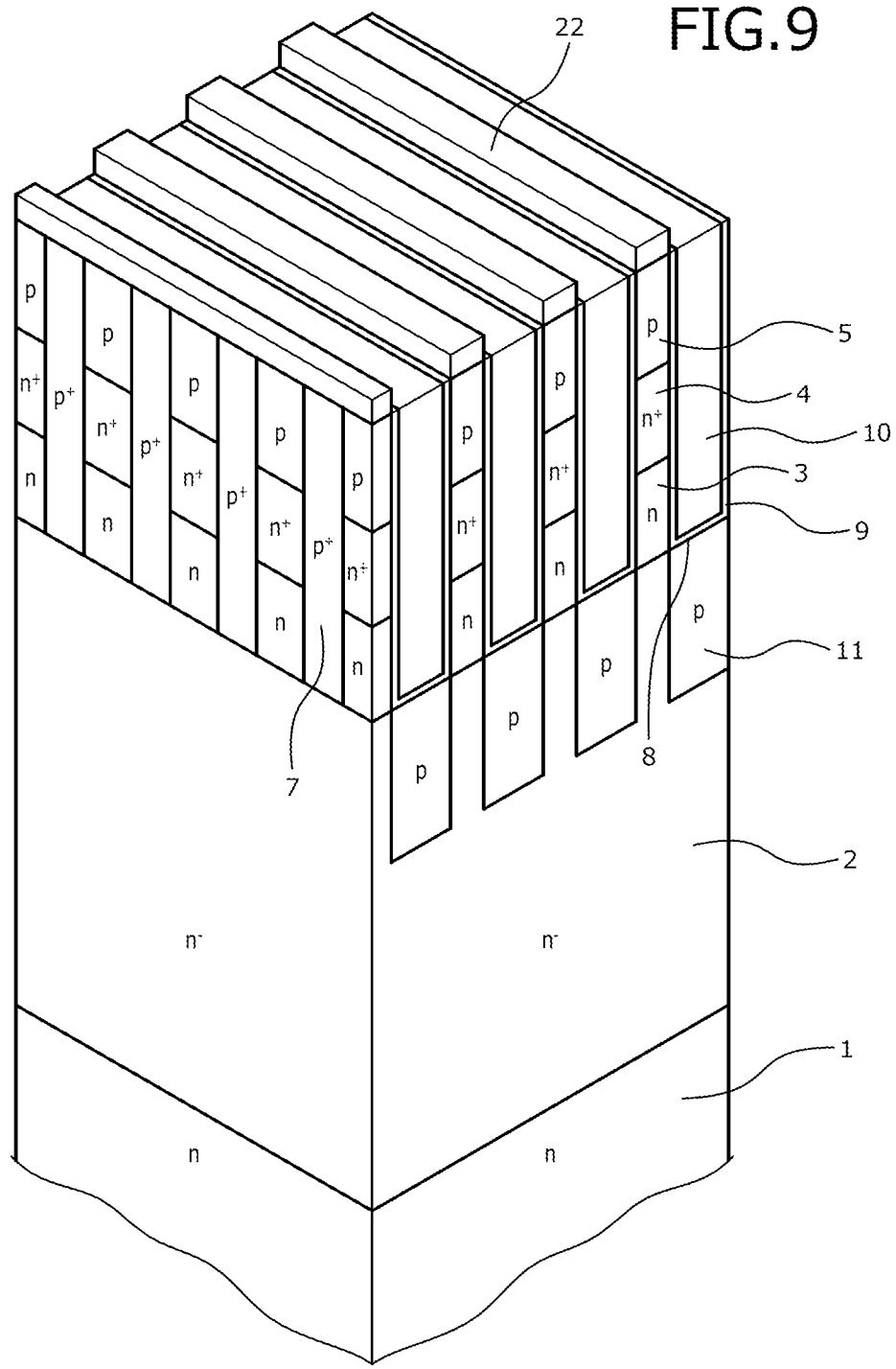

After removing the overall oxide film on the inner wall of the trench 8, an oxide film ($SiO_2$) having a thickness of, for example, 0.1 µm is deposited along the inner wall of the trench 8 to be the gate insulation film 9. A nitriding treatment is applied to the surface of the gate insulation film 9 using, for example, a nitrogen monoxide (NO) gas. As depicted in FIG. 9, a poly-silicon (poly-Si) layer is embedded on the inner side of the gate insulation film 9 in the trench 8. Extra poly-silicon on the SiC epitaxial substrate is removed by etching back, and a poly-silicon layer to be the gate electrode 10 is left in the trench 8.

Figure 10:
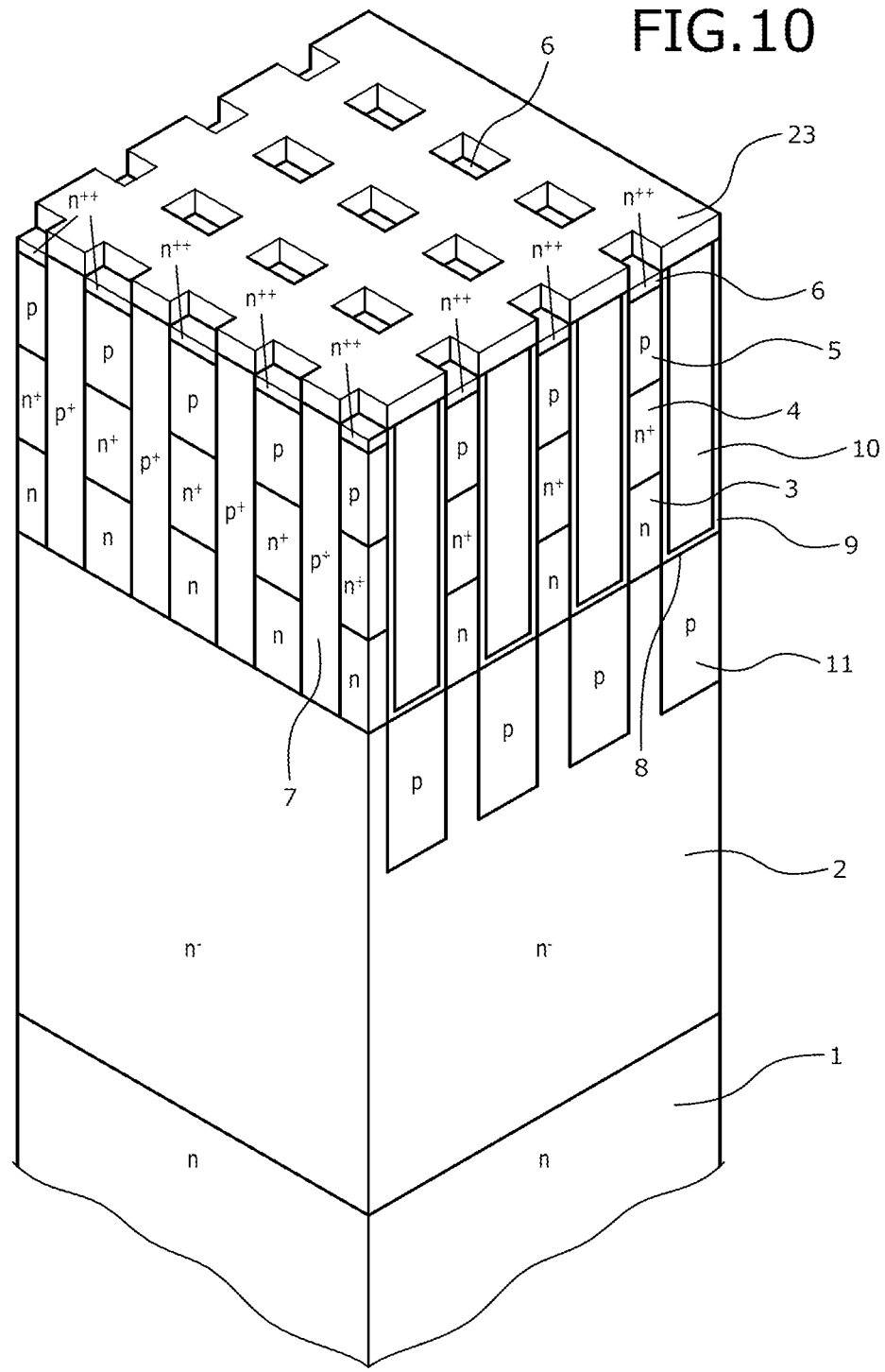

After removing the overall oxide film 22, as depicted in FIG. 10, an oxide film 23 having a thickness of, for example, 0.4 µm is newly deposited on the front face of the SiC epitaxial substrate. Patterning is applied to the oxide film 23 to expose the p-type base layer 5. The p-type base layer 5 is disposed in a matrix-shape consequent to the formation of the $P^+$-type body region 7 and the trench 8 that orthogonally cross each other in the stripes at the previous process step. Openings are formed in a matrix-shape in the oxide film 23 and the remaining portion of the oxide film 23 remains in a grid-shape by applying patterning to the oxide film 23 to expose the p-type base layer 5.

Figure 11:
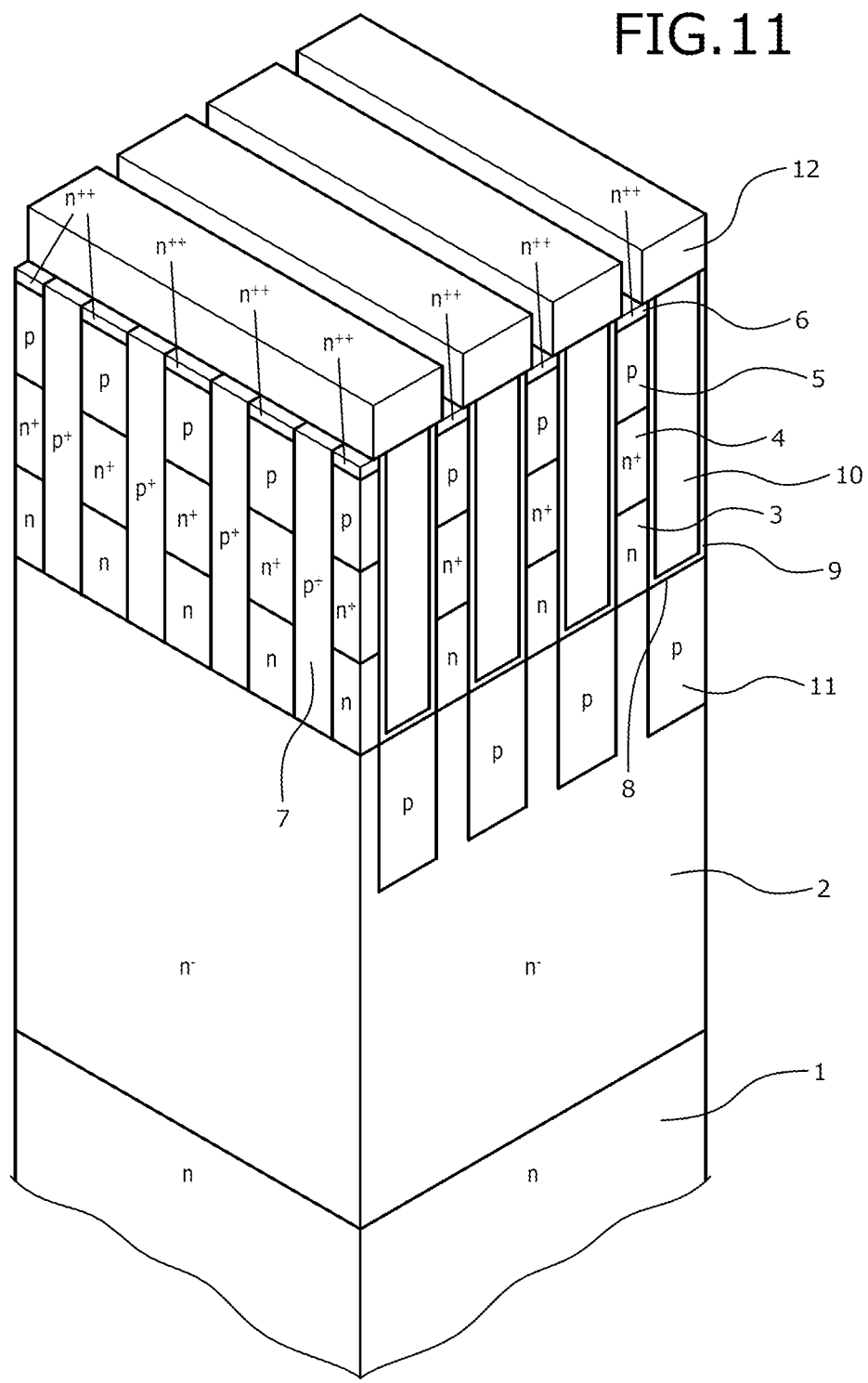

An n-type impurity such as phosphorus (P) is ion-implanted at a dose of, for example, $5.0 \times 10^{15}/cm^2$ using the remaining portion of the oxide film 23 as a mask. The crystal faults are recovered and the n-type impurity implanted into the p-type base layer 5 is activated by annealing (a thermal treatment) at, for example, 1700 degrees C. and, thereby, the $n^{++}$-type emitter region 6 is formed. After removing the overall oxide film 23, as depicted in FIG. 11, a high temperature oxide (HTO) film having a thickness of 0.2 µm and a Borophosphosilicate glass (BPSG) film having a thickness of 0.6 µm are sequentially grown as the interlayer insulator film 12 on the front face of the SiC epitaxial substrate.

Patterning is applied to the interlayer insulator film 12 to form stripe-like contact holes each having a width of, for example, 1.0 µm and extending in the trench longer dimension direction and thereby, the $n^{++}$-type emitter region 6 and the $p^+$-type body region 7 are exposed. To secure the contact (an electric contact portion) with the $p^+$-type body region 7, an aluminum film (not depicted) having a thickness of, for example, 50 nm is formed on the front face of the SiC epitaxial substrate using a sputtering method. Patterning is applied to the aluminum film to leave the aluminum film on the $p^+$-type body region 7 and remove the aluminum film of other portions except that on the $p^+$-type body region 7. To secure the contact with the $n^{++}$-type emitter region 6, a nickel (Ni) film (not depicted) having a thickness of, for example, 50 nm is formed on the front face of the SiC epitaxial substrate using the sputtering method. Hereinafter, the aluminum film and the nickel film to secure the contacts with the $p^+$-type body region 7 and the $n^{++}$-type emitter region 6 will be referred to as "front face metal".

Figure 12:
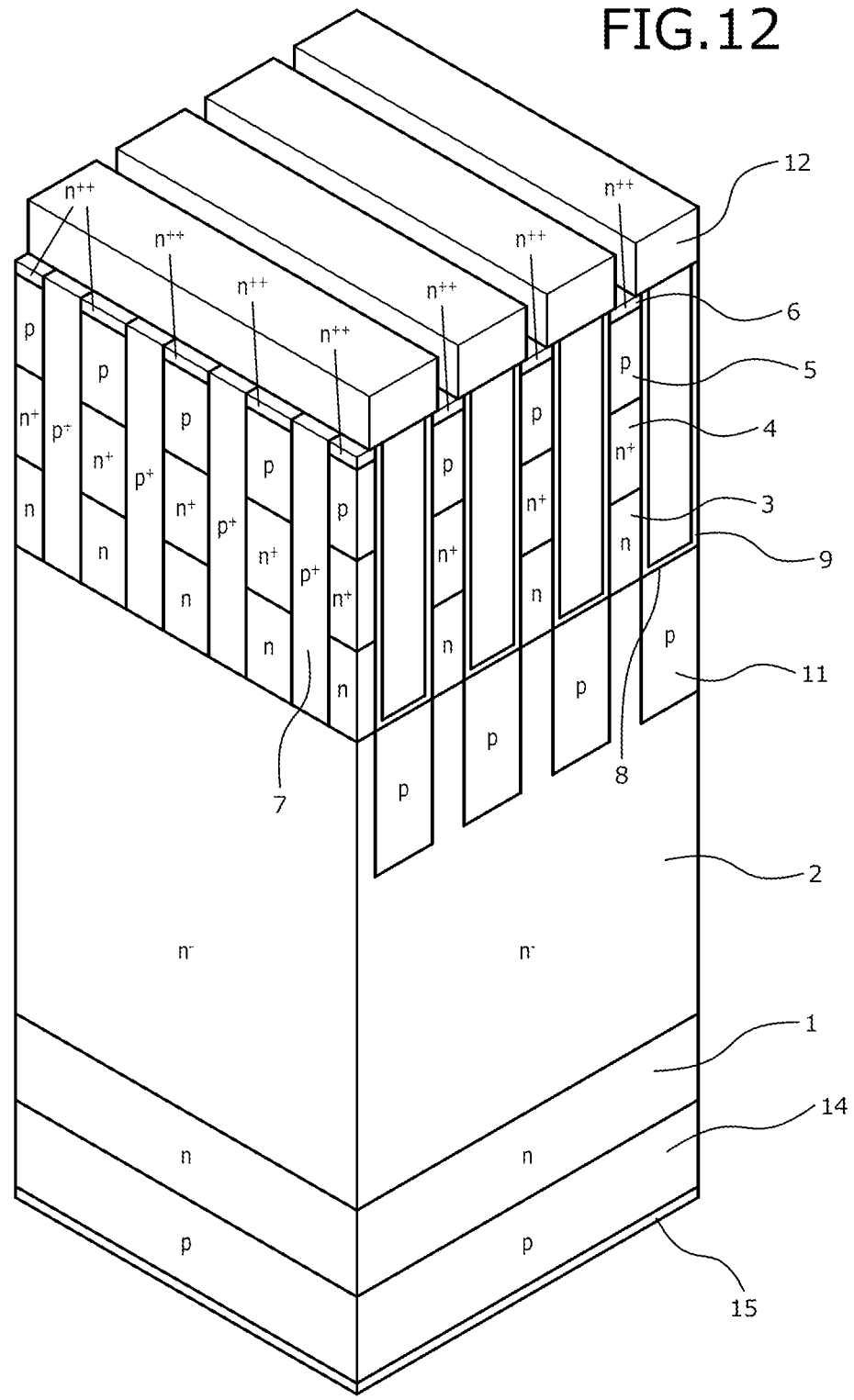

After protecting the front face of the SiC epitaxial substrate using a resist protective film (not depicted), as depicted in FIG. 12, the SiC epitaxial substrate is ground from the back face thereof (that is, the back face of the n-type SiC substrate 1) to a position to acquire a product thickness for use as a semiconductor device. At this step, the grinding is executed until the thickness of the SiC epitaxial substrate (the total thickness of the n-type SiC substrate 1, the $n^-$-type drift layer 2, the high concentration n-type drift layer 3, the $n^+$-type CS layer 4, and the p-type base layer 5) reaches, for example, 160 µm. The thickness of the n-type SiC substrate 1 is further reduced using mechanical polishing and the thickness of the SiC epitaxial substrate is reduced to 140 µm. The remaining thickness of the n-type SiC substrate 1 is, for example, 20 µm at the process steps executed so far.

For example, the substrate temperature is set to be at 500 degrees C. and a p-type impurity such as aluminum is ion-implanted at a dose of $1.0 \times 10^{13}/cm^2$ using an acceleration energy of 600 keV to form the p-type buffer layer 14 in the surface layer of the back face of the SiC epitaxial substrate. The substrate temperature is then set to be at 500 degrees C. and a p-type impurity such as aluminum is ion-implanted at a dose of $5.0 \times 10^{15}/cm^2$ using an acceleration energy of 30 keV to form the $p^+$-type collector layer 15 in the surface layer of the p-type buffer layer 14. Any annealing (the thermal treatment) for activation is not executed for the p-type buffer layer 14 and the $p^+$-type collector layer 15 and crystal faults are caused to remain in the p-type buffer layer 14 and the $p^+$-type collector layer 15.

To secure the contact with the $p^+$-type collector layer 15, an aluminum film (not depicted) and a nickel film (not depicted) are sequentially formed on the overall surface of the $p^+$-type collector layer 15 using the sputtering method. Hereinafter, the stacked films including the aluminum film and the nickel film to secure the contacts with the p+-type collector layer 15 will be referred to as "back face metal". After removing the resist protective film on the front face of the substrate, sintering (a thermal treatment) is executed for the front face metal, the emitter electrode 13, and the back face metal formed on the front face and the back face of the SiC epitaxial substrate using, for example, lamp annealing.

An aluminum layer having a thickness of, for example, 5 μm is formed on the front face of the SiC epitaxial substrate using the sputtering method and patterning is applied to this aluminum layer. Thereby, the emitter electrode 13 is formed. For example, a polyimide film (not depicted) is formed on the front face of the SiC epitaxial substrate. Patterning is applied to the polyimide film to expose a portion of the emitter electrode 13 as an electrode pad and thereafter, the polyimide film is cured (baked). The collector electrode 16 formed by layering titanium (Ti), nickel, and gold (Au) on each other is formed on the back face of the SiC epitaxial substrate. Thereafter, the SiC epitaxial substrate is diced into individual chips. Thereby, the SiC-IGBT chip depicted in FIG. 1 is completed.

Figure 13:
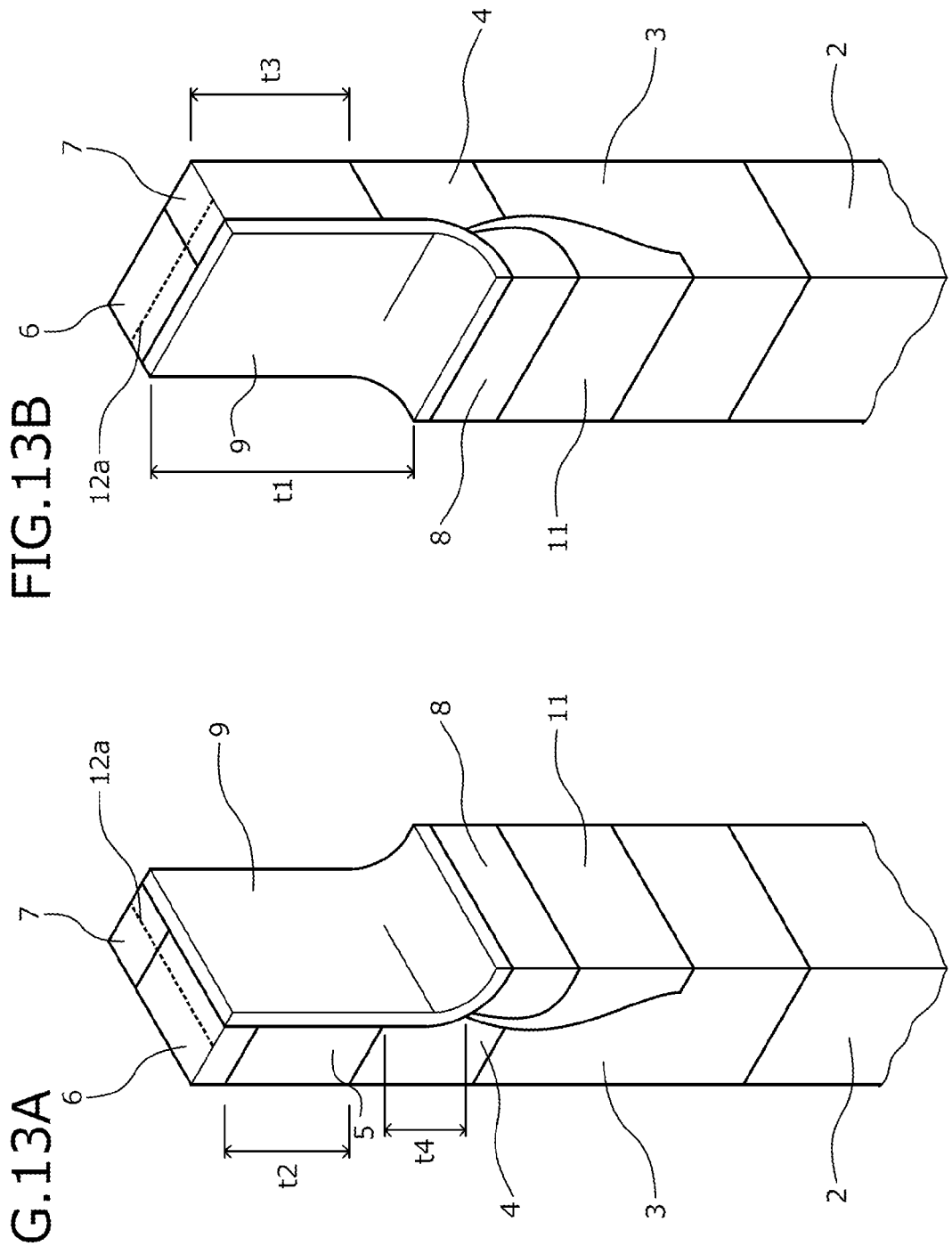
FIGS. 13A and 13B are perspective diagrams of a unit cell structure of a 13-kV breakdown voltage class.
Figure 14:
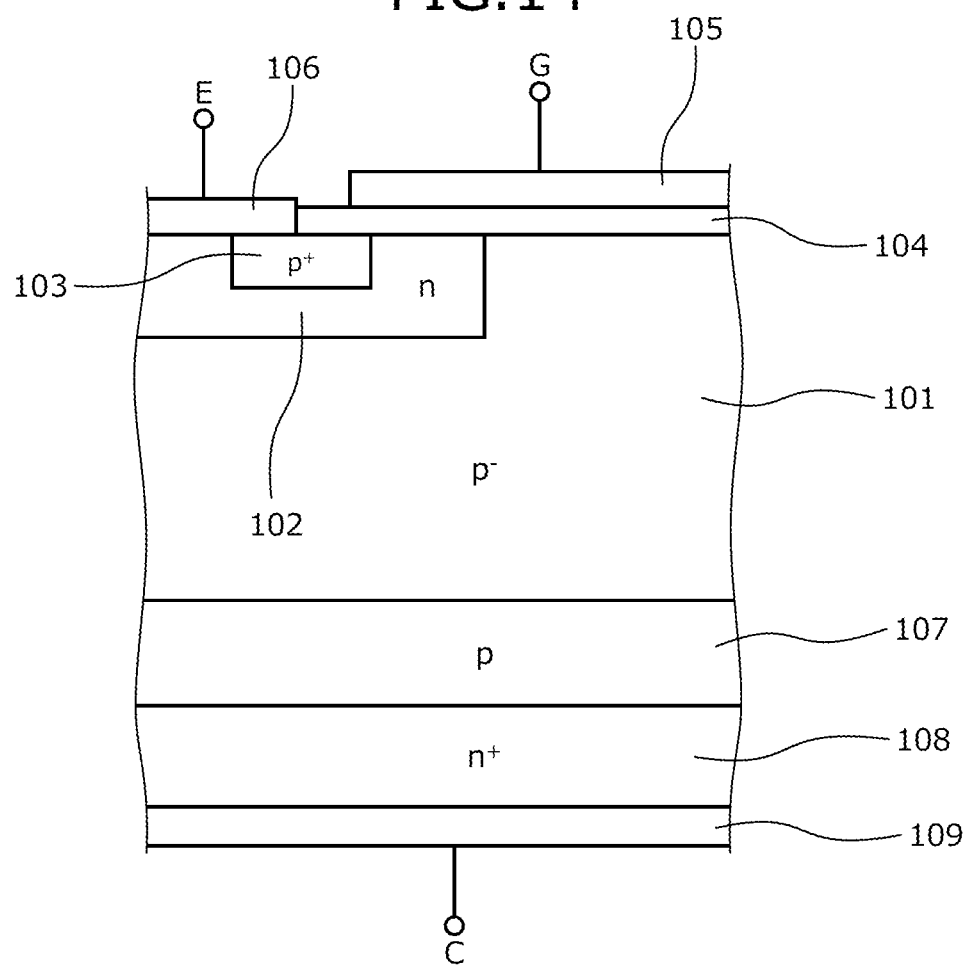
FIGS. 14 and 15 are cross-sectional views of the structure of a conventional planar gate SiC-IGBT.
Figure 15:
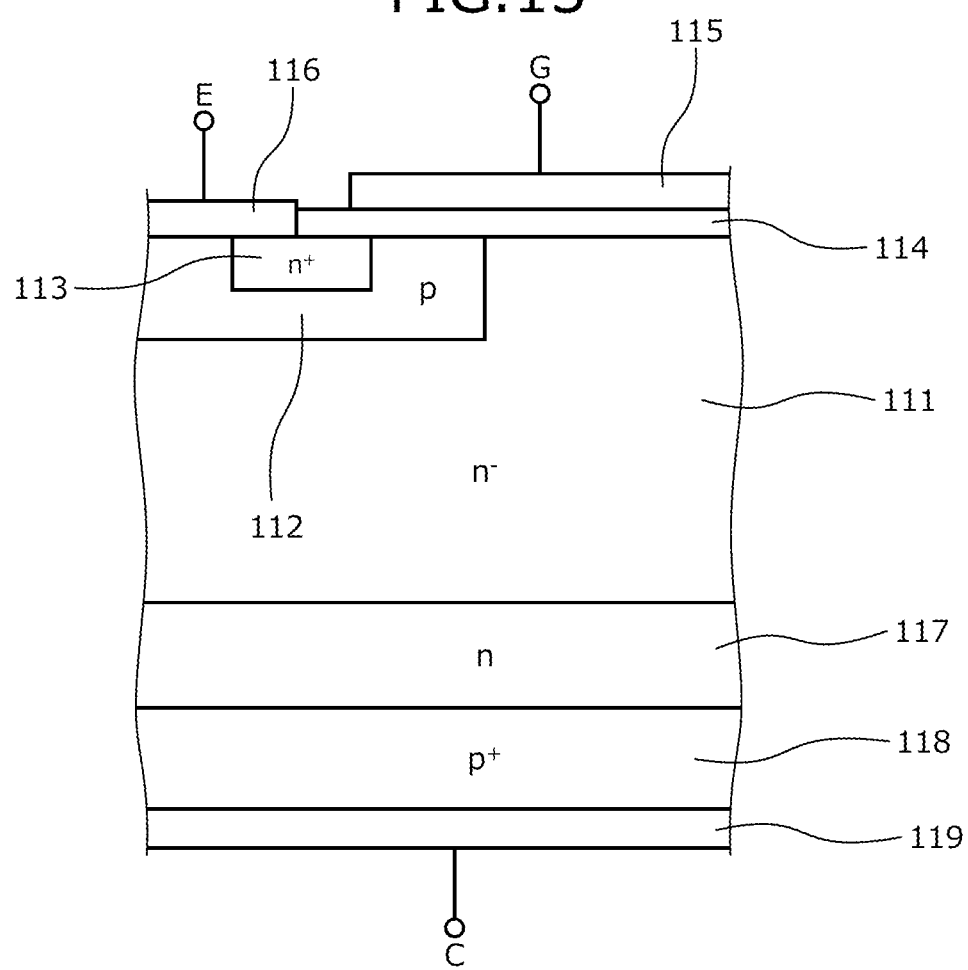

The SiC-IGBT of the 13-kV breakdown voltage class (hereinafter, referred to as "EXAMPLE") was fabricated according to the fabrication method of a semiconductor device of the embodiment, and the "ON" voltage and the maximal electric field intensity of the gate insulation film 9 of the SiC-IGBT were verified. FIGS. 13A and 13B are perspective diagrams of a unit cell structure of the 13-kV breakdown voltage class. The dimensions and the impurity concentrations of the components of EXAMPLE were set to be the following values. As depicted in FIGS. 13A and 13B, the depth t1 of the trench 8 was set to be a depth such that the trench 8 penetrated the $n^{++}$-type emitter region 6, the p-type base layer 5, and the $n^+$-type CS layer 4 and reached the high concentration n-type drift layer 3. For example, the depth t1 of the trench 8 was 1.3 μm. The thickness t2 of the p-type base layer 5 and the impurity concentration thereof were respectively set to be 0.7 μm and $2.5 \times 10^{17}/cm^3$. The "thickness t2 of the p-type base layer 5" refers to the thickness of the portion remaining immediately under the $n^{++}$-type emitter region 6 (on the n-type SiC substrate 1 side) after the $n^{++}$-emitter region 6 was formed in the surface layer of the p-type base layer 5. The thickness t3 of the $p^+$-type body region 7 and the impurity concentration thereof were respectively set to be 0.8 μm and $5.0 \times 10^{19}/cm^3$. The distance t4 in the depth direction between the p-type guard region 11 and the p-type base layer 5 was set to be 0.3 μm. In FIGS. 13A and 13B, a reference numeral "12a" denotes a contact hole.

It was confirmed by the inventor for EXAMPLE that the maximal breakdown voltage was 16.5 kV when the junction (the p-n junction) temperature was room temperature (for example, 25 degrees C.); and the "ON" voltage at the junction temperature of 250 degrees C. and with the rated current of 100 A/cm² was a low value of 3.3 V. It was also confirmed by the inventor that the critical electric field intensity at the interface between the SiC semiconductor portion in the vicinity of the side wall of the trench 8 and the gate insulation film 9 was a very low value of 0.9 MV/cm during the breakdown (the voltage drop) when 16.5 kV was applied to the collector electrode 16. Thereby, it was confirmed that film quality degradation due to the rush of the carriers into the gate insulation film 9 was able to be prevented.

As described, according to the embodiment, the p-type base layer is divided by disposing the $p^+$-type body region at the predetermined depth, and this causes the p-type base layer to be sandwiched between the $p^+$-type body regions adjacent to each other in the trench longer dimension direction. Thereby, the p-type base layer can be prevented from being prone to being depleted and the element breakdown voltage can be secured sufficiently. According to the embodiment, the high concentration n-type drift layer is disposed between the $n^-$-type drift layer and the $n^+$-type CS layer and thereby, the voltage drop due to the hole current in the mesa region can be set to be greater than or equal to the built-in voltage of the silicon carbide semiconductor. The IE effect can, therefore, be enhanced and the "ON" voltage can be reduced compared to those of the traditional case. According to the embodiment, the p-type guard region is disposed in the vicinity of the bottom portion of the trench and thereby, the electric field can be alleviated at the interface between the silicon carbide semiconductor portion and the gate insulation film. The gate insulation film, therefore, is not prone to being degraded by the rush of the carriers into the gate insulation film, and the long term reliability of the gate insulation film can be improved.

In the description above, the present invention can be changed variously and, in the embodiment, for example, the dimensions and the impurity concentrations of the components are variously set depending on the required specification, etc. In the embodiment, the first conductivity type is set to be "n-type" and the second conductivity type is set to be "p-type" while the present invention is similarly established even when the first conductivity type is set to be "p-type" and the second conductivity type is set to be "n-type".

As described above, the semiconductor device and the fabrication method of a semiconductor device according to the present invention are useful for a power semiconductor device used in an electric power converting apparatus, etc., and is especially suitable for an insulated gate IGBT of the trench gate type, that uses the silicon carbide semiconductor material.

According to the semiconductor device and the fabrication method of the semiconductor device of the present invention, with the trench gate semiconductor device using the silicon carbide semiconductor, a sufficient breakdown voltage can be assured and the "ON" voltage can be reduced. According to the semiconductor device and the fabrication method of the semiconductor device of the present invention, an effect is achieved that the gate insulation film is not prone to degradation due to the rush of carriers into the gate insulation film and the long term reliability of the gate insulation film can be improved because the electric field can be alleviated at the interface between the silicon carbide semiconductor portion and the gate insulation film.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

This application is based upon and claims the benefit of priority of the prior Japanese Patent Application No. 2014-092132, filed on Apr. 25, 2014, the entire contents of which are incorporated herein by reference.

What is claimed is:
1. A semiconductor device comprising:
   a first semiconductor layer of a first conductivity type and formed of a silicon carbide semiconductor;
   a second semiconductor layer of the first conductivity type and formed of the silicon carbide semiconductor having an impurity concentration higher than that of the first semiconductor layer, the second semiconductor layer being disposed on one face of the first semiconductor layer;

a third semiconductor layer of the first conductivity type and formed of the silicon carbide semiconductor having an impurity concentration higher than that of the second semiconductor layer, the third semiconductor layer being disposed on a face that with respect to a first semiconductor layer side of the second semiconductor layer, is on an opposite aspect of the second semiconductor layer;

a fourth semiconductor layer of the second conductivity type and formed of the silicon carbide semiconductor, the fourth semiconductor layer being disposed on a face that with respect to a first semiconductor layer side of the third semiconductor layer, is on an opposite aspect of the third semiconductor layer;

a first semiconductor region of the first conductivity type and selectively disposed inside the fourth semiconductor layer;

a plurality of trenches that respectively penetrate the fourth semiconductor layer and the first semiconductor region in a depth direction orthogonal to the one face of the first semiconductor layer, the plurality of trenches being disposed at predetermined intervals in a first direction parallel to the one face of the first semiconductor layer, the plurality of trenches extending in a second direction orthogonal to the first direction and parallel to the one face of the first semiconductor layer to form stripes;

a gate electrode that is disposed inside each trench through a gate insulation film;

a second semiconductor region of the second conductivity type, having an impurity concentration higher than that of the fourth semiconductor layer, and selectively disposed inside the fourth semiconductor layer, the second semiconductor region having a depth deeper than that of the fourth semiconductor layer and shallower than that of the plurality of trenches;

a third semiconductor region of the second conductivity type that is disposed to cover a bottom portion of the plurality of trenches;

a fifth semiconductor layer of the second conductivity type and disposed on the other face of the first semiconductor layer;

an emitter electrode that is in contact with the first semiconductor region and the second semiconductor region; and a collector electrode that is in contact with the fifth semiconductor layer.

2. The semiconductor device according to claim 1, wherein the third semiconductor region is disposed along a bottom portion of the plurality of trenches, in the second direction.

3. The semiconductor device according to claim 1, wherein the second semiconductor region is disposed at predetermined intervals in the second direction, with second semiconductor regions facing each other and sandwiching a trench therebetween.

4. A fabrication method of a semiconductor device, the fabrication method comprising:

forming on a first semiconductor layer of a first conductivity type and formed of a silicon carbide semiconductor, a second semiconductor layer of the first conductivity type and formed of a silicon carbide semiconductor having an impurity concentration higher than that of the first semiconductor layer;

forming on the second semiconductor layer, a third semiconductor layer of the first conductivity type and formed of the silicon carbide semiconductor having an impurity concentration higher than that of the second semiconductor layer;

forming on the third semiconductor layer, a fourth semiconductor layer of the second conductivity type and formed of the silicon carbide semiconductor;

forming a second semiconductor region of the second conductivity type and having an impurity concentration higher than that of the fourth semiconductor layer, the second semiconductor region being formed inside the fourth semiconductor layer at a depth deeper than a depth of the fourth semiconductor layer and in a planar pattern extending in stripes in a first direction parallel to one face of the first semiconductor layer;

forming a plurality of trenches at a depth deeper than a depth of the second semiconductor region, the plurality of trenches being formed in stripes extending in a second direction orthogonal to the first direction and parallel to the one face of the first semiconductor layer, and penetrating the fourth semiconductor layer in a depth direction orthogonal to the one face of the first semiconductor layer;

forming a third semiconductor region of the second conductivity type, in a semiconductor portion exposed in a bottom portion of each trench among the plurality of trenches;

forming inside each trench, a gate electrode through a gate insulation film;

forming in the fourth semiconductor layer, a first semiconductor region of the first conductivity type in a portion sandwiched between adjacent trenches;

forming a fifth semiconductor layer of the second conductivity type on the other face of the first semiconductor layer;

forming an emitter electrode in contact with the first semiconductor region and the second semiconductor region; and forming a collector electrode in contact with the fifth semiconductor layer.

* * * * *